United States Patent
Birner et al.

(10) Patent No.: US 6,863,769 B2
(45) Date of Patent: Mar. 8, 2005

(54) CONFIGURATION AND METHOD FOR MAKING CONTACT WITH THE BACK SURFACE OF A SEMICONDUCTOR SUBSTRATE

(75) Inventors: Albert Birner, Dresden (DE); Martin Franosch, München (DE); Matthias Goldbach, Dresden (DE); Volker Lehmann, München (DE); Jörn Lützen, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/661,340

(22) Filed: Sep. 12, 2003

(65) Prior Publication Data

US 2004/0104402 A1 Jun. 3, 2004

Related U.S. Application Data

(63) Continuation of application No. PCT/DE02/00670, filed on Feb. 22, 2002.

(30) Foreign Application Priority Data

Mar. 12, 2001 (DE) .......................................... 101 11 761

(51) Int. Cl.$^7$ ............................................ H01L 21/306
(52) U.S. Cl. ............. 156/345.11; 156/345; 156/345.19; 257/181; 257/414; 257/703; 438/107; 438/421; 438/746
(58) Field of Search ............................ 156/345, 345.11, 156/345.19; 257/181, 414, 703; 438/107, 421, 746

(56) References Cited

U.S. PATENT DOCUMENTS

| | | | |
|---|---|---|---|
| 5,071,510 A | | 12/1991 | Findler et al. |
| 5,209,833 A | | 5/1993 | Foell et al. |
| 5,324,410 A | * | 6/1994 | Kummer et al. ....... 204/297.05 |
| 6,120,657 A | | 9/2000 | Billman |
| 6,171,437 B1 | * | 1/2001 | Shimizu et al. ........ 156/345.23 |
| 6,444,027 B1 | * | 9/2002 | Yang et al. ................. 117/200 |
| 6,579,408 B1 | * | 6/2003 | Su et al. ................ 156/345.11 |

FOREIGN PATENT DOCUMENTS

| | | |
|---|---|---|
| DE | 40 03 472 A1 | 4/1991 |
| DE | 197 28 962 A1 | 1/1999 |
| JP | 06120204 A | 4/1994 |
| WO | 92/02948 | 2/1992 |
| WO | 00/59008 A3 | 10/2000 |

* cited by examiner

Primary Examiner—David Nelms
Assistant Examiner—Dao H. Nguyen
(74) Attorney, Agent, or Firm—Laurence A. Greenberg; Werner H. Stemer; Gregory L. Mayback

(57) ABSTRACT

A base body is provided, on which a first sealing ring and a second sealing ring are disposed. A substrate is disposed on the sealing rings in such a way that a cavity is formed between the first sealing ring, the second sealing ring, the base body and the substrate. An etching substance can be introduced into the cavity in order to etch clear a conductive layer that has been applied to the substrate. When a conductive layer that has been applied to the substrate back surface has been uncovered, an electrolyte can be introduced into the cavity, making contact with the conductive layer and therefore the substrate back surface.

9 Claims, 3 Drawing Sheets

CONFIGURATION AND METHOD FOR MAKING CONTACT WITH THE BACK SURFACE OF A SEMICONDUCTOR SUBSTRATE

CROSS-REFERENCE TO RELATED APPLICATION

This application is a continuation of copending International Application No. PCT/DE02/00670, filed Feb. 22, 2002, which designated the United States and was not published in English.

BACKGROUND OF THE INVENTION

Field of the Invention

The present invention relates to a configuration and a method for making contact with the back surface of a semiconductor substrate.

The fabrication of semiconductor components makes use of method steps that require electrical contact to be made with the substrate that is to be processed. This is the case, for example, in electrical or electrochemical process steps. In order to enable a very large number of identical components to be fabricated in parallel on a semiconductor substrate, it is necessary for the substrate to be processed uniformly by the process step. This requires contact-making methods which make electrical contact which is as homogeneous as possible with respect to the substrate. If homogeneous electrical contact is not ensured, there is a variation in the electrical potential over the substrate, which can make its presence felt by an inhomogeneous process control and prevents uniform execution of the process step. The fluctuation leads to a non-uniform electrodeposition in the case of a negative substrate potential and to a non-uniform anodic dissolution in the case of a positive substrate potential.

In the case of anodic dissolution of the substrate, for example given suitably selected doping and electrolyte composition, pores are formed when there is a low anodic potential and electropolished surfaces are formed when there is a high anodic potential. Therefore, the semiconductor components formed are highly dependent on the applied potential, which can prevent the formation of functioning semiconductor components.

The formation of pores in silicon is of interest, for example, for the manufacture of trench capacitors, since the formation of pores allows the surface area to be increased considerably, with an associated increase in capacitance. What are known as mesopores with a pore diameter in the range from 2 to 10 nanometers (nm) are particularly suitable pores. Since, as has already been mentioned above, the formation of pores is dependent on the electrical potential, it is of considerable importance for this potential to be applied to the substrate in such a manner that it is distributed as uniformly as possible over the substrate.

By way of example, International Patent Disclosure WO 92/02948 A1, corresponding to U.S. Pat. No. 5,324,410, discloses making contact with the wafer back surface with the aid of one or more spring contacts. This too has the drawback that the desired potentials can in each case only be generated locally, and on the wafer back surface the potential may fluctuate at relatively great distances from the contact points. Moreover, a particular drawback is that metal is brought into contact with the wafer. When fabricating integrated circuits with ever smaller feature sizes, a metal contact with the wafer should be ruled out at least in the front end process, for reasons, for example, of particle contamination from particles which become detached.

A known method for producing uniform back-surface contact with a semiconductor substrate over the entire surface is known, for example, in U.S. Pat. No. 5,209,833. In this case, electrolyte contact is made with the substrate back surface, ensuring that there is very little fluctuation in the contact resistance between substrate and electrolyte.

However, the method for forming an electrolyte back-surface contact over the entire surface is complex in terms of process technology.

SUMMARY OF THE INVENTION

It is accordingly an object of the invention to provide a configuration and a method for making contact with the back surface of a semiconductor substrate that overcome the above-mentioned disadvantages of the prior art devices and methods of this general type.

With the foregoing and other objects in view there is provided, in accordance with the invention, a configuration for making contact with a semiconductor substrate. The configuration contains a first sealing ring, a second sealing ring being larger than the first sealing ring, and a base body having a base-body surface. The first sealing ring and the second sealing ring are disposed on the base-body surface. The first sealing ring is disposed completely inside a region of the base-body surface surrounded by the second sealing ring. The base body has a first opening and a second opening each starting from the base-body surface and extending between the first sealing ring and the second sealing ring. A semiconductor substrate is provided and has a first main surface and a second main surface. The semiconductor substrate is disposed on the first sealing ring and the second sealing ring with the first main surface facing the base body. A conductive layer having a surface is disposed on the semiconductor substrate. The conductive layer is disposed such that a current impressed into the conductive layer is uniformly distributed across the first main surface of the semiconductor substrate. A first line system is connected to the first opening for admitting and discharging at least one electrically conductive liquid. A second line system is connected to the second opening for admitting and discharging the electrically conductive liquid. A contact wire is disposed uncovered on the base-body surface of the base body between the first sealing ring and the second sealing ring.

The configuration according to the invention allows homogeneous electrical back-surface contact to be made with the wafer by partial electrolytic contact-making. It contains two sealing rings in a base body. The substrate may, for example, be applied to the sealing rings, and the substrate back surface can be etched clear of an insulator in the circular ring between the two sealing rings, with the result that, for example, a conductive layer which has been applied to the back surface of the substrate is uncovered. Then, an electrolyte can be used to make contact with the uncovered conductive layer between the two sealing rings. The contact used for the electrolyte is the contact wire that is disposed in the annular strip between the first and second sealing rings. The conductive layer in the substrate makes it possible for the current which has been introduced via the electrolyte contact to be distributed uniformly over the substrate back surface and to flow from the substrate back surface to the substrate front surface.

There is provision for the substrate, which contains a first main surface and a second main surface, to be disposed on the first sealing ring and the second sealing ring.

Furthermore, there is provision for a conductive layer, which has a surface, to be disposed on the first main surface.

The conductive layer is used to distribute a current uniformly over the substrate back surface.

Furthermore, there is provision for a first insulating layer, which is removed in the region between the first sealing ring and the second sealing ring, to be disposed on the conductive layer. The removal of the insulating layer between the first and second sealing ring has the advantage that it is possible to form electrical contact with the conductive layer and therefore with the substrate back surface between the first sealing ring and the second sealing ring.

A further advantageous configuration of the invention provides for a cavity to be delimited by the first sealing ring, the second sealing ring, the base body and the substrate. The cavity has the advantage that, for example, an etching substance can be introduced into the cavity, by which the insulating layer can be removed from the conductive layer. Furthermore, the cavity has the advantage that an electrolyte can be introduced into the cavity and can be used to form electrical contact between the contact wire and the conductive layer.

In this case, it is advantageous for that region of the substrate surface which is enclosed between the first sealing ring and the second sealing ring to be formed in the shape of a ring at the wafer edge, since at that location the thickness of an insulating layer is usually lower than in the center of the back surface of the wafer. The insulator layer, which is thinner at the edge, has the advantage that it can be removed more quickly from the conductive layer in the edge region. Furthermore, the etching time required to uncover the conductive layer can be shortened by using special holding clamps during nitride or polysilicon deposition, these clamps reducing deposition in the region between the first sealing ring and the second sealing ring.

With regard to the method, the object is achieved by a method for making contact with a semiconductor substrate. The method includes the steps of:

a) providing a base body, which has a base-body surface, on which a first sealing ring and a second sealing ring are disposed, the first sealing ring being smaller than the second sealing ring and the first sealing ring being disposed completely inside that region of the base-body surface which is surrounded by the second sealing ring;

b) a first opening and a second opening being disposed in the base body, starting from the base-body surface, between the first sealing ring and the second sealing ring;

c) a contact wire being disposed uncovered on the base-body surface of the base body between the first sealing ring and the second sealing ring;

d) providing a substrate which contains a first main surface and a second main surface, a conductive layer being disposed on the first main surface;

e) disposing the first substrate with the first main surface on the first sealing ring and the second sealing ring, a cavity being formed, which is delimited by the first sealing ring, the second sealing ring, the base-body surface and the substrate; and f) introducing an electrolyte through the first opening into the cavity, an electrical connection being formed between the conductive layer and the contact wire.

The method according to the invention forms electrical contact with the back surface of a semiconductor wafer. The electrical contact is in this case formed in the cavity, which runs in the form of a ring on the substrate back surface. It is advantageous in this case that the wet—chemical treatment is limited to the region of the cavity, with the result that the complex handling of the semiconductor wafer in the event of treatment of the entire area of the back surface can be avoided. The conductive layer results in the current which is introduced into the substrate back surface being distributed uniformly over the substrate back surface, allowing a homogeneous flow of current from the substrate back surface to the substrate front surface.

A method step provides for an insulating layer to be disposed on the conductive layer and for an etching substance, which removes the insulating layer from the conductive layer, to be introduced into the cavity. The etching-clear of the conductive layer preferably takes place in the cavity, with the result that the conductive layer is uncovered in order to make electrical contact.

A further method step provides for a barrier layer to be formed between the substrate and the conductive layer. The barrier layer is used, for example, to prevent the substrate from being contaminated by materials that are disposed in the conductive layer. For this purpose, the barrier layer may, for example, have a diffusion barrier action. Furthermore, it can advantageously be used as a bonding agent for the conductive layer. Furthermore, there is provision for the barrier layer to be conductive.

A further method step provides for the insulating layer to be formed of silicon nitride or silicon oxide and to be etched using an etchant that contains hydrofluoric acid or nitric acid, with the result that the conductive layer is uncovered.

A further method step provides for the insulating layer to be removed by a dry, etching process that uses an etching mask that has been applied to the substrate.

Other features which are considered as characteristic for the invention are set forth in the appended claims.

Although the invention is illustrated and described herein as embodied in a configuration and a method for making contact with the back surface of a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
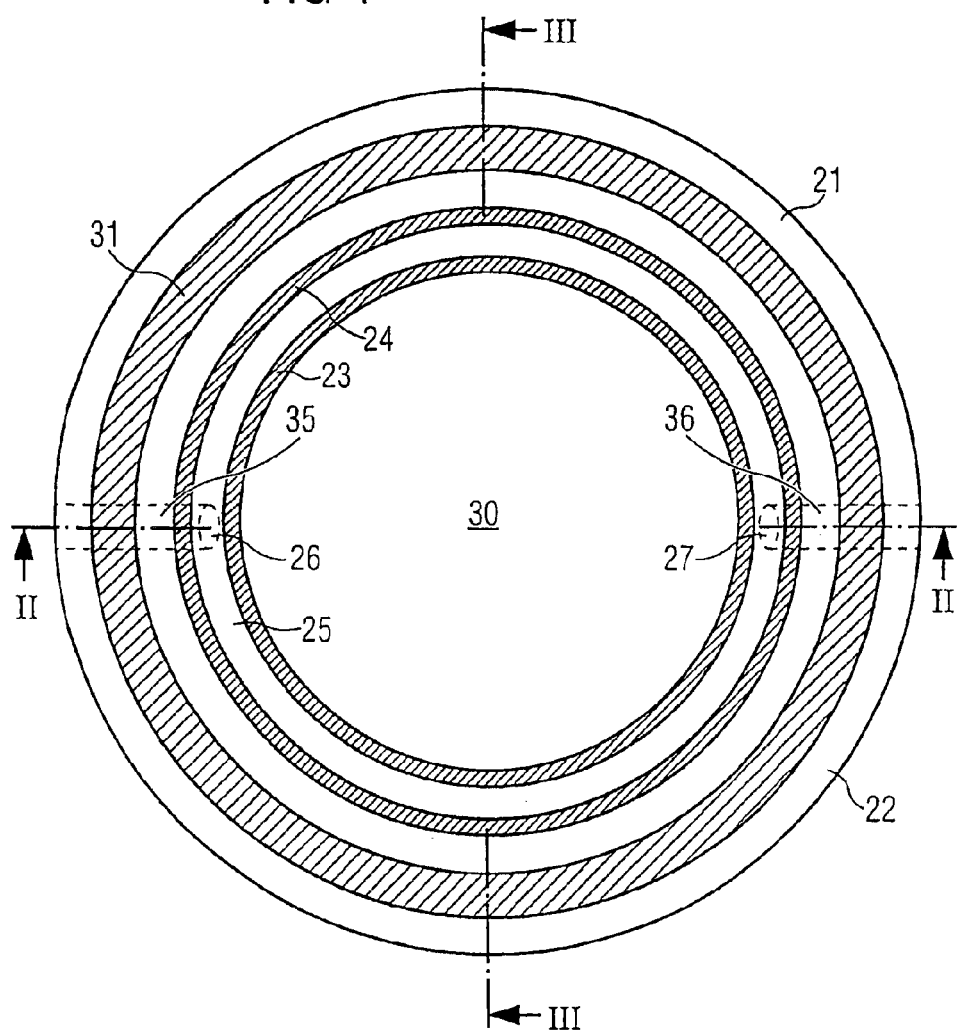
FIG. 1 is diagrammatic, plan view of a base body with sealing rings and which is suitable for receiving a semiconductor substrate according to the invention.

Referring now to the figures of the drawing in detail and first, particularly, to FIG. 1 thereof, there is shown a base body 21 which has a base-body surface 22. A first sealing ring 23 and a second sealing ring 24 are disposed on the base-body surface 22. The first sealing ring 23 is smaller than the second sealing ring 24, and the first sealing ring 23 is disposed completely inside that region 30 of the base-body surface 22 which is surrounded by the second sealing ring 24. Furthermore, a first opening 26 and a second opening 27 are disposed between the first sealing ring 23 and the second sealing ring 24. The first opening 26 is connected, for example, to an inlet 35, through which gases and liquids can be introduced into the region between the first sealing ring 23 and the second sealing ring 24. The second opening 27 is connected, for example, to an outlet 36, through which liquid and gases can be removed from the space between the first sealing ring 23 and the second sealing ring 24. If, by way of example, a semiconductor substrate 1 is placed onto the first sealing ring 23 and the second sealing ring 24, a cavity 25 is formed, which is delimited by the first sealing ring 23, the second sealing ring 24, the base-body surface 22 and the semiconductor substrate 1. By way of example, gases and liquids can be introduced into and discharged from the cavity 25 through the first opening 26 and the second opening 27. FIG. 1 also illustrates a third sealing ring 31, which is larger than the first sealing ring 23 and the second sealing ring 24.

Figure 2:
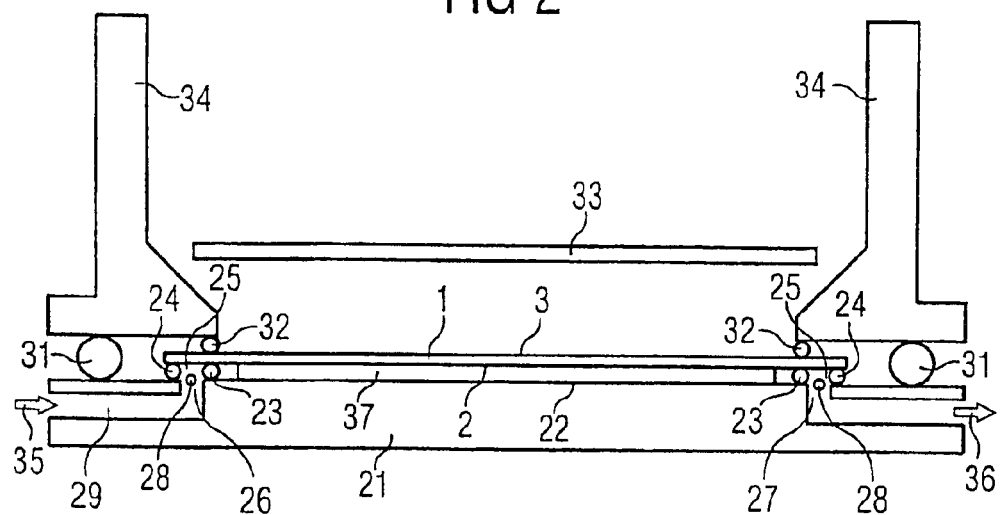
FIG. 2 is a sectional view taken along the line II—II through the base body illustrated in FIG. 1.
Figure 3:
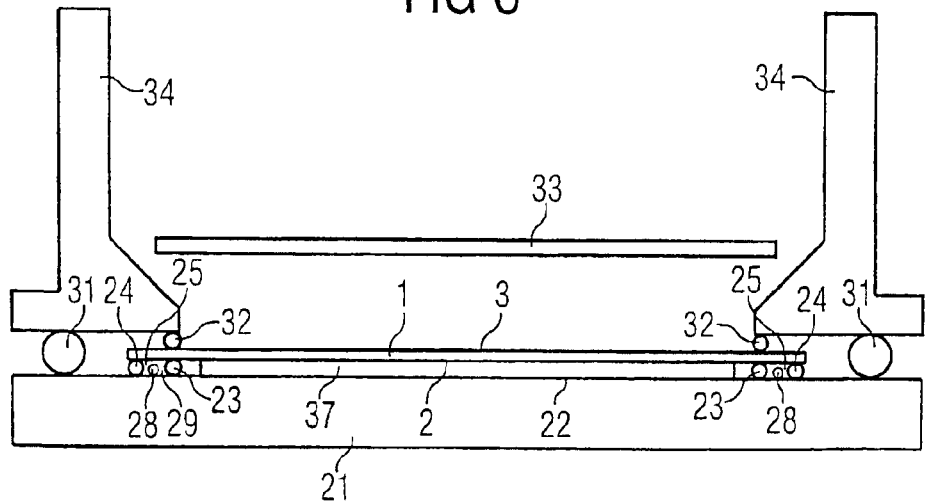
FIG. 3 is a sectional view taken along the line III—III through the base body illustrated in FIG. 1.

FIG. 2 shows a sectional illustration taken along section line II—II. The base body 21 has the base-body surface 22, on which the first sealing ring 23 and the second sealing ring 24 are disposed. The semiconductor substrate 1, which has a first main surface 2 and a second main surface 3, is disposed on the first sealing ring 23 and the second sealing ring 24. The first main surface 2 faces the base body 21 and rests on the first and second sealing rings 23, 24. The first opening 26 and the second opening 27 are disposed in the base body 21, between the first sealing ring 23 and the second sealing ring 24. The first opening 26 is connected to the inlet 35, and the second opening 27 is connected to the outlet 36. The third sealing ring 31 is disposed on the base body 21, and a fourth sealing ring 32 is disposed on the second main surface 3 of the substrate 1. An etching cup 34 is applied to the third sealing ring 31 and the fourth sealing ring 32. A liquid which can wet the second main surface 3 of the substrate 1 and with which electrical contact can be made by a counter electrode 33, can be introduced into the etching cup 34. In the cavity 25 between the first sealing ring 23 and the second sealing ring 24, a contact wire 28 is disposed on the base-body surface 22 of the base body 21. In addition, there is a bearing 37 on which the substrate 1 can rest when a process liquid is being introduced into the etching cup 34. FIG. 3 presents a sectional illustration taken along the section line III—III shown in FIG. 1. The configuration illustrated in FIG. 3 differs from FIG. 2 in that the first opening 26 and the inlet 35, and also the second opening 27 and the outlet 36, are not disposed on section line III—III.

Figure 4:
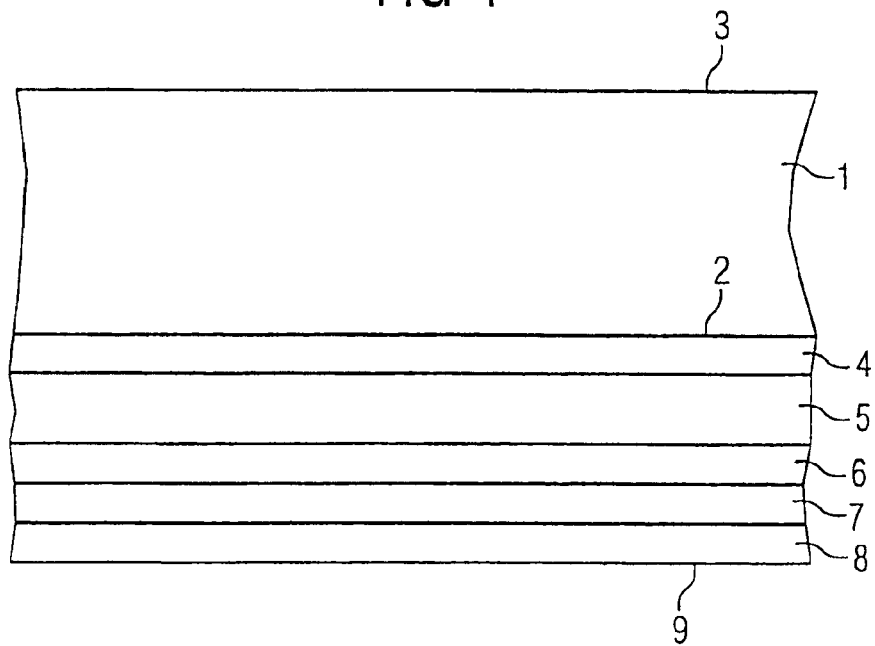
FIG. 4 is a sectional view of a substrate with a conductive layer that has been applied to the substrate back surface.

FIG. 4 illustrates the substrate 1 that has the first main surface 2 and the second main surface 3. By way of example, the first main surface 2 is designated the substrate back surface, and the second main surface 3 is designated the substrate front surface, in which, by way of example, electrical components, such as transistors, capacitors and resistors, are formed. A barrier layer 4 is disposed on the first main surface 2. A conductive layer 5 is disposed on the barrier layer 4. A first insulating layer 6 is disposed on the conductive layer 5, a second insulating layer 7 is disposed on the first insulating layer 6, and a further layer 8 with a surface 9 is disposed on the second insulating layer 7. Further configurations of the configuration illustrated in FIG. 4 are also possible, for example without the barrier layer 4 and without the insulating-layer stack containing the layers 6, 7 and 8. It is also possible for one or more of the layers 4, 6, 7 and 8 to be provided.

A method for making contact with the back surface of the substrate 1 is described below with reference to FIG. 2. The substrate 1 is placed on top of the first sealing ring 23 and the second sealing ring 24, the surface 9 facing towards the base body 21. The conductive layer 5 is disposed on the first main surface 2 of the substrate 1. If, by way of example, an insulating layer is disposed on the conductive layer 5, an etchant is admitted into the inlet 35 and passes through the opening 26 into the cavity 25, removing the insulating layer 6 from a circular region of the conductive layer 5. In the process, the etchant flows through the cavity 25 to the second opening 27 and through the outlet 36. When the conductive layer 5 has been uncovered in the annular region between the first sealing ring and the second sealing ring, an electrolyte is introduced through the inlet 35 and the first opening 26 into the cavity 25, with the result that electrical contact is formed between the conductive layer 5 and the contact wire 28. Current can then be introduced through the electrolyte into the conductive layer 5 via the contact wire 28, and this current, on account of the good conductivity of the conductive layer 5, can flow, with a uniform distribution over the substrate back surface, uniformly through the substrate 1 to the front surface of the substrate 1. If, by way of example, a conductive liquid has been introduced into the etching cup 34, the electric current flows onward from the second main surface 3 through the conductive liquid to the counter electrode 33.

After the conductive layer has been etched clear in the annular cavity 25, the cavity 25 can be cleaned and purged, for example with deionized water, before the electrolyte is introduced. After the electrochemical processing of the second main surface 3 has finished, the electrolyte can be removed from the cavity 25, a subsequent purge with deionized water can be carried out, and then drying with nitrogen can take place.

The conductive layer 5 may be formed, for example, from metals or silicides. A suitable metal is, for example, tungsten, while a suitable silicide is, for example, tungsten silicide. It is also possible for the conductive layer 5 to be formed from tungsten nitride. The barrier layer 4 may, for example, likewise be formed from tungsten silicide.

We claim:

1. A configuration for making contact with a semiconductor substrate, the configuration comprising:

a first sealing ring;

a second sealing ring being larger than said first sealing ring;

a base body having a base-body surface, said first sealing ring and said second sealing ring disposed on said base-body surface, said first sealing ring being disposed completely inside a region of said base-body surface being surrounded by said second sealing ring, said base body having a first opening and a second opening formed therein each starting from said base-body surface and extending between said first sealing ring and said second sealing ring;

a semiconductor substrate having a first main surface and a second main surface, said semiconductor substrate disposed on said first sealing ring and said second sealing ring with said first main surface facing said base body;

a conductive layer having a surface disposed on said semiconductor substrate, said conductive layer disposed such that a current impressed into said conductive layer being uniformly distributed across said first main surface of said semiconductor substrate;

a first line system connected to said first opening for admitting and discharging at least one electrically conductive liquid;

a second line system connected to said second opening for admitting and discharging the electrically conductive liquid; and a contact wire disposed uncovered on said base-body surface of said base body between said first sealing ring and said second sealing ring.

2. The configuration according to claim 1, further comprising a first insulating layer disposed on said conductive layer but removed in a region between said first sealing ring and said second sealing ring.

3. The configuration according to claim 2, further comprising an electrolyte source and an etchant source being switchably connected to said first line system.

4. The configuration according to claim 1, wherein said first sealing ring, said second sealing ring, said base-body surface, and said semiconductor substrate delimit a cavity.

5. A method for making contact with a semiconductor substrate, which comprises the following steps:

providing a base body having a base-body surface, a first sealing ring disposed on the base-body surface, and a second sealing ring disposed on the base-body surface, the first sealing ring being smaller than the second sealing ring, the first sealing ring disposed completely inside a region of the base-body surface surrounded by the second sealing ring;

forming a first opening and a second opening in the base body, starting from the base-body surface, between the first sealing ring and the second sealing ring;

disposing a contact wire uncovered on the base-body surface of the base body between the first sealing ring and the second sealing ring;

providing a substrate having a first main surface and a second main surface;

disposing a conductive layer on the first main surface such that a current impressed into the conductive layer being uniformly distributed across the first main surface;

disposing the substrate with the first main surface on the first sealing ring and the second sealing ring so that the first main surface faces the base body, a cavity being formed and delimited by the first sealing ring, the second sealing ring, the base-body surface and the first main surface of the substrate;

introducing an electrolyte through the first opening into the cavity, an electrical connection being formed between the conductive layer and the contact wire; and discharging the electrolyte through the second opening.

6. The method according to claim 5, which further comprises:

disposing an insulation layer on the conductive layer;

introducing an etching substance, for removing the insulation layer from the conductive layer, into the cavity through the first opening; and discharging the etching substance from the cavity through the second opening.

7. The method according to claim 6, which further comprises forming the insulation layer from a material selected from the group consisting of silicon nitride and silicon oxide; and using an etchant, selected from the group consisting of hydrofluoric acid and nitric acid, for etching the insulation layer and during the etching the conductive layer is uncovered.

8. The method according to claim 6, which further comprises performing a dry-etching process, using an etching mask applied to the substrate, for removing the insulation layer.

9. The method according to claim 5, which further comprises forming a barrier layer, serving as at least one of a diffusion barrier and a bonding agent, between the substrate and the conductive layer.

* * * * *